United States Patent
George et al.

(10) Patent No.: US 6,613,383 B1
(45) Date of Patent: Sep. 2, 2003

(54) ATOMIC LAYER CONTROLLED DEPOSITION ON PARTICLE SURFACES

(75) Inventors: Steven M. George, Boulder, CO (US); John D. Ferguson, Boulder, CO (US); Alan W. Weimer, Niwot, CO (US)

(73) Assignee: Regents of the University of Colorado, Boulder, CO (US)

( * ) Notice: Subject to any disclaimer, the term of this patent is extended or adjusted under 35 U.S.C. 154(b) by 0 days.

(21) Appl. No.: 09/602,602

(22) Filed: Jun. 21, 2000

Related U.S. Application Data

(60) Provisional application No. 60/140,083, filed on Jun. 21, 1999.

(51) Int. Cl.$^7$ .............................. B05D 7/00; B32B 5/16
(52) U.S. Cl. ...................... 427/212; 427/213; 427/215; 427/216; 427/218; 428/402; 428/403; 428/404
(58) Field of Search ................................. 428/402, 403, 428/404; 427/215, 216, 218, 212, 213

(56) References Cited

U.S. PATENT DOCUMENTS

| | | | | |
|---|---|---|---|---|
| 3,647,358 A | | 3/1972 | Greenburg | 423/210.5 |
| 5,082,826 A | * | 1/1992 | Ferrando | 505/1 |
| 5,223,341 A | * | 6/1993 | Sigai | 428/404 |
| 5,271,969 A | * | 12/1993 | Ogura | 427/561 |
| 5,273,942 A | * | 12/1993 | McCauley | 501/92 |
| 5,705,265 A | | 1/1998 | Clough et al. | 428/307.3 |
| 5,985,175 A | * | 11/1999 | Fan | 252/301.4 R |

OTHER PUBLICATIONS

Rony, Diffusion Kinetics Within Supported Liquid–Phase Catalysts, Journal of Catalysis 14, 142–147 (1969).
Yin et al., Study of Supported Liquid Phase Catalysts for Hydroformylation of Olefins Contained in FCC Dry Gas, Beijing, China, vol. 2, 614–620 (1991).
Wu et al., Catalytic Hydrodechlorination of $CCL_4$ Over Silia–Supported $PDCL_2$–Containing Molten Salt Catalysts: The Promotional Effects of $COCL_2$ and $CUCL_2$ Journal of Catalysis 161, 164–177 (1996).
Schmitz et al., Highly Active Methanol Dissociation Catalysts Derived from Supported Molten Salts, Dept. of Chem., Energy and Fuels 1994, 8, 729–740.
Hoffmeister et al., The Influence of the Pore Structure of the Support on the Properties of Supported Liquid–Phase Catalysts, Chem. Engineering Science, vol. 45, No. 8, 2275–2580 (1990).
Kolodziej et al., A Study of the Internal Diffusion of Gases in Porous Catalysts in the Presence of a Liquid Phase, Chemical Engineering and Processing, 31, 255–261 (1992).
Jutka et al., Investigations on the use of Supported Liquid–Phase Catalysts in Fluidized Bed Reactors, Institute for Technology, vol. 88, No. 289, 122–129.
Jelles et al., Supported Liquid Phase Catalysts, Studies in Surface Science and Catalysis, vol. 116, 667–674 (1998).
Freeman et al., Thermal Destruction of Hazardous Waste– A State of the Art View, Journal of Hazardous materials 14, 103–117 (1987).
Brusewitz et al., Problems in use of Supported Liquid–Phase Catalysts in Fluidized Bed Reactors, Chem. Eng. Technol. 15, 385–389 (1992).
Johanson et al., Elimination of Hazardous Wastes by the Molten Salt Destruction Process, Rockwell International, 234–242 (1991).
Stelman et al., Treatment of Mixed Wastes by the Molten Salt Oxidation Process, Rockwell International, 795–799 (1992).
Upadhye, Molten Salt Destruction of Energetic Material Wastes as an Alternative to Open Burning, Chemistry for the Protection of the Environment 2, 267–276 (1996).
Upadhye, Molten Salt Takes the Bang out of High Explosives, http://www.llnl.gov/str/upadhye.html, 1–4 (2000).
Greenburg, Method of Catalytically Inducing Oxidation of Carbonaceous Materials by the Use of Molten Salts, U.S. Patent 3647358 (1972).
Klaus et al., Atomic Layer Cantrolled Growth of $SIO_2$ Films Using Binary Reaction Sequence Chemistry, Appl. Phys. Lett. 70, 1092–1094 (1997).
Dillon et al., Surface Chemistry of $AL_2O_3$ Deposition Using $AL(CH_3)_3$ and $H_2O$ in a Binary Reaction Sequence, Surface Science 322, 230–242 (1995).
Sneh et al., Atomic Layer Growth of $SIO_2$ on IS(100) Using $SICL_4$ and $H_2O$ in a Binary Reaction Sequence, Surface Science 344, 135–152 (1995).
Dillou Surface Chemistry of AL203 . . . Aug. 1994.*
Sneh Atomic layer growth of $SiO_2$ . . . Mar. 1995.*
Klaus Atomic layer controlled growth . . . Mar. 1997.*

* cited by examiner

Primary Examiner—Leszek Kiliman
(74) Attorney, Agent, or Firm—Gary C Cohn PLLC

(57) ABSTRACT

Particles have an ultrathin, conformal coating are made using atomic layer deposition methods. The base particles include ceramic and metallic materials. The coatings can also be ceramic or metal materials that can be deposited in a binary reaction sequence. The coated particles are useful as fillers for electronic packaging applications, for making ceramic or cermet parts, as supported catalysts, as well as other applications.

26 Claims, No Drawings

ATOMIC LAYER CONTROLLED DEPOSITION ON PARTICLE SURFACES

CROSS-REFERENCE TO RELATED APPLICATION

This application claims benefit of provisional application 60/140,083, filed Jun. 21, 1999, entitled "Atomic Layer Controlled Deposition on Particle Surfaces", which is incorporated herein by reference in its entirety.

BACKGROUND OF THE INVENTION

This invention relates to particles having ultrathin coatings on their surfaces and to methods for making and using such coated particles.

Ceramics and metals are used in particulate form in a variety of industrial settings, such as in the electronics and structural advanced materials industries. It is often desirable to alter the surface properties of these particles while maintaining their bulk properties.

For example, in some cases the particles have reactive surfaces that can be attacked by the surrounding environment or which otherwise engage in undesirable reactions. In these cases, it is often desirable to passivate the reactive surfaces to inhibit these reactions from occurring.

Conversely, it is desirable in other situations to activate the particle surfaces for various reasons, such as to improve coupling to other materials (or between particles) or to promote desired chemical reactions. In this manner, it would be desired to provide for improved coupling at ceramic/polymeric, ceramic/metallic (cermet), or ceramic/ceramic (monolithic or composite) particulate interfaces. For example, boron nitride (BN) and aluminum nitride (AlN) particles have been developed as fillers for electronics packaging applications. These materials significantly enhance the thermal conductivity of polymer based composite packages, while maintaining good electrical insulation. These properties are becoming increasingly important as faster and denser integrated circuits are being developed by the microelectronics industry. The high thermal conductivity of BN and AlN make them attractive candidates for filler materials. However, the surfaces of BN and AlN particles are relatively nonreactive and do not adhere well to the coupling agents commonly used with these epoxy polymers. This incompatibility with the polymer makes it difficult to load these materials at levels sufficient for use with newer, high-density integrated circuits. Thus, it is desirable to find a way to improve the adhesion of these particles to the polymer matrix and to incorporate more of these nitride particles into the packaging material without significantly decreasing the thermal conductivity of the particles.

Another example of the desire to modify surface properties of materials comes from the ceramics industry. The development of sintering methods has enabled the widespread use of advanced ceramic materials for various applications. Densification of a ceramic material through sintering can be achieved by several methods that involve heating constituent particles either with pressure (such as hot-pressing, hot isostatic pressing, or gas pressure assisted sintering) or without pressure (such as pressureless sintering). Pressureless sintering is a preferred method due to its low cost. However, it requires the development of specialized processing formulations that usually involve liquid phase sintering. It is important to be able to control the surface properties of the constituent particles during pressureless sintering densification. In addition, it is desirable in these sintering applications to obtain a uniform dispersion of sintering aids, and to disperse the sintering aid as finely as possible.

Thus, it would be desirable to provide a method by which the surface properties of particulate materials can be modified without significantly changing the bulk properties of the particulate material.

SUMMARY OF THE INVENTION

In one aspect, this invention is a material in the form of particles having an average diameter of up to about 500 microns wherein the particles have an ultrathin, conformal coating on the surface thereof In another aspect, this invention is a method for depositing an ultrathin conformal coating on particles, comprising conducting a sequence of two or more self-limiting reactions at the surface of said particles to form an ultrathin conformal coating bonded to the surface of said particles.

In a third aspect, this invention is a resin matrix filled with particles of an inorganic material, wherein the particles have an ultrathin conformal coating on their surfaces.

In a fourth aspect, this invention is a method of making a cermet part, comprising forming a shaped mass from a plurality of particles of a sinterable inorganic material that have an ultrathin conformal metal coating on their surfaces, and then exposing said shaped mass to conditions sufficient to sinter the particles to form a shaped part.

In a fifth aspect, this invention is a method of making a ceramic part, comprising forming a shaped mass from a plurality of particles of a sinterable inorganic material that have an ultrathin conformal coating of a sintering aid on their surfaces, and then exposing said shaped mass to conditions sufficient to sinter the particles to form a shaped part.

In a sixth aspect, this invention is a method of catalyzing a chemical reaction, comprising conducting said chemical reaction in the presence of particles having an average diameter of less than 500 microns and having on their surfaces an ultrathin conformal coating of a metal which is a catalyst for said chemical reaction.

DETAILED DESCRIPTION OF THE INVENTION

In this invention, ultrathin conformal coatings are provided onto the surfaces of various particulate materials. The size of the particles will depend somewhat on the particular material and the particular application. Suitable particle sizes range up to about 500 μm, with preferred particle sizes ranging from the nanometer range (e.g. about 0.001 μm) to about 100 μm, more preferred particle sizes ranging from 0.005 to about 50 μm, even more preferred particle sizes ranging from about 0.1 to 10 μm and most preferred particle sizes ranging from about 0.4 to about 10 μm. Particle size can also be expressed in terms of the surface area of the particles. Preferred particulate materials have surface areas in the range of about 0.1 to 200 $m^2/g$ or more.

A wide variety of particulate materials can be used, with the composition of the base particle and that of the coating typically being selected together so that the surface characteristics of the particle are modified in a way that is desirable for a particular application. The base particles preferably have some functional group on the surface that can participate in a reaction sequence that creates the ultrathin coating. Examples of such functional groups include hydroxyl groups, amino groups and metal-hydrogen bonds, which can serve as a site of further reaction to allow formation of the ultrathin coating. If necessary, the surface of the particle can be treated to introduce such functional groups. Depending on the particular base particle, techniques such as water plasma treatment, ozone treatment, ammonia treatment and hydrogen treatment are among the useful methods of introducing functional groups.

Inorganic materials are of particular interest as the base particle. Several types that are of particular interest are those which (1) are sinterable with the use of a sintering aid to form a ceramic part, (2) are useful as high thermal conductivity fillers, such as for electronic packaging applications, (3) have reactive surfaces that are desirably passivated for certain applications, (4) are useful in making cermet (ceramic metallic) composite materials or (5) are useful supports for other materials, such as catalyst supports. It will be recognized that many materials are useful for more than one of these applications.

Examples of inorganic materials that can be sintered to form ceramic parts include, for example various nitrides, carbides, borides and other nonoxide ceramic materials.

Inorganic materials that are useful as high thermal conductivity fillers for electronics packaging applications preferably have bulk thermal conductivities of greater than about 3 W/mK, preferably greater than 5 W/mK, more preferably greater than 10 W/mK, even more preferably greater than about 15 W/mK and most preferably greater than about 200 W/mK. Suitable such materials include, for example, silicon dioxide, alumina, nitrides of Groups 3, 13 and 14 elements and carbides of Group 4, 6, 13 and 14 elements. Preferred nitrides for filler applications include aluminum nitride (AlN), boron nitride (BN) (especially hexagonal BN) and silicon nitride ($Si_3N_4$). A preferred carbide is tungsten carbide (WC).

Examples of inorganic materials having reactive surfaces that are desirably passivated for certain applications include, for example, inorganic oxides such as alumina, titania, silica and zirconia as well as titanium carbide, boron carbide, silicon nitride and aluminum nitride. Among these, of particular interest are the so-called "nanosized" particles having particle diameters of less than about 10 nanometers. Many of these extremely small particles tend to be extremely sensitive to oxidation.

Inorganic materials useful in cermet applications include nonoxide inorganic materials such as, for example, silicon nitride, aluminum nitride, boron nitride, tungsten carbide, boron carbide and titanium carbide.

Inorganic materials that are useful support materials include alumina, silica, and various natural and synthetic zeolite materials.

In addition, particulate metals are of interest, particularly particulate metals of the iron group, such as iron, cobalt and nickel, as well as various alloys.

The particles have an ultrathin conformal coating. By "ultrathin", it is meant that the thickness of the coating is up to about 100 nm, more preferably from about 0.1 to about 50 nm, even more preferably from about 0.5–35 nm and most preferably from about 1 and about 10 nm. By "conformal" it is meant that the thickness of the coating is relatively uniform across the surface of the particle, so that the surface shape of the coated particle closely resembles that of the uncoated particle.

As is true of the underlying particle, the composition of the coating can vary considerably depending on the composition of the underlying particle and the intended end-use of the coated particle. Coatings that can be applied via atomic layer controlled growth techniques as described more below are preferred. Among coatings that are readily applied in such a manner are binary materials, i.e., materials of the form $Q_xR_y$, where Q and R represent different atoms and x and y are numbers that reflect an electrostatically neutral material. Among the suitable binary materials are various inorganic oxides (such as silicon dioxide and metal oxides such as zirconia, alumina, silica, boron oxide, yttria, zinc oxide, magnesium oxide, $TiO_2$ and the like), inorganic nitrides such as silicon nitride, AlN and BN, inorganic sulfides such as gallium sulfide, tungsten sulfide and molybdenum sulfide, as well as inorganic phosphides. In addition, various metal coatings are useful, including cobalt, palladium, platinum, zinc, rhenium, molybdenum, antimony, selenium, thallium, chromium, platinum, ruthenium, iridium, germanium and tungsten.

The coating may perform a variety of functions, depending on the nature of the base particle and the intended application. Thus, one function of the coating may be to modify the surface properties of the base particle. For example, when the base particle is a filler material, the coating may be a material that improves the compatibility of the particle with the continuous phase material (for example, a thermoplastic or thermoset resin). This can permit, for example, higher filler loadings without significant change of the bulk properties of the base particle. Specific examples of this include AlN, BN or $Si_3N_4$ particles that are coated with silica or alumina in order to make them more compatible in an epoxy resin matrix for electronics packaging applications. Another possible function of the coating involves the case where a base particle has a surface that behaves in some undesirable way in a particular environment. In these cases, a coating of a material that is relatively nonreactive in that environment or which masks the undesirable behavior is useful. Thus, for example, metal particles can be coated with a layer of an electrical insulator layer. Another example is a protective coating that isolates the base particle from its environment. Thus, metal particles can be protected from oxidation by applying a coating that isolates the metal from environmental oxidants. Similarly, particles that are hydrolytically unstable can be coated with a layer of a hydrolytically stable material, and so forth.

Alternately, the coating may itself be a reagent or catalyst in some chemical reaction. In these cases, this invention provides a convenient method of providing a high surface area reactive or catalytic material, and/or provides a way for finely dispersing the coating material. For example, a particle of a sinterable material can be coated with a material such as an oxide glass (such as yttria and alumina) that functions as a sintering aid. This invention thus provides a way to obtain an extremely fine and uniform dispersion of a sintering aid when making ceramic or cermet parts. Similarly, particles of a sinterable material can be coated with a metal. When the particles are shaped and sintered, the metal becomes finely and uniformly dispersed within the part. Thus, particles of this type are particularly well adapted for cermet manufacture. In addition, the coating can be a metal that functions as a reagent or catalyst in one or more chemical reactions. The metal is coated onto any suitable support to provide a high surface area catalyst.

Illustrative combinations of substrate particulate materials and coatings are:
1. Group 3, 13 or 14 nitride particles, such as AlN, BN and $Si_3N_4$ particles, coated with silica or alumina. These are useful for fillers for thermoplastic and thermoset resins, particularly epoxy resins such as are used in electronics packaging applications.
2. Group 3, 13 or 14 nitride particles, such as AlN, BN and $Si_3N_4$ particles, or Group 4, 6 or 13 or 14 carbide particles, especially tungsten carbide, boron carbide and titanium carbide particles, coated with an oxide glass or a metal. A suitable oxide glass is preferably yttrium oxide, alumina or a mixture of these. The metal is any that can function as a sintering aid or as the metal phase in a cermet part, such as cobalt, tungsten or nickel aluminide. Examples of specific combinations are aluminum nitride, boron nitride, silicon nitride or tungsten carbide coated with yttrium oxide, tungsten carbide coated with cobalt, boron carbide coated with aluminum metal and titanium carbide coated with nickel aluminide. These particles are useful in making ceramic or cermet parts. The particles can be very small particles (i.e., having surface area of 100 m$^2$/g or more) such as can be made in vapor phase processes. These particles can be coated according to the invention before being exposed to air.

3. Alumina, silica, titania or zeolite particles that are coated with a passivating coating. Coatings of particular interest are nitrides, especially Group 3, 13 or 14 nitrides, preferably AlN, BN or $Si_3N_4$. These particles can be used as fillers in applications where alumina, silica or zeolite would otherwise react in an undesirable way, as the passivating coating isolates the base particle from the environment. In the case of titania, the coated particles can exhibit reduced photocatalyic properties, which can be useful in certain coating applications.

4. Metal particles coated with an oxide coating, such as alumina, silica or yttrium oxide, with a nitride coating such as AlN, BN or $Si_3N_4$, or a sulfide coating such as gallium sulfide. Metals that oxidize easily are of particular interest, as these coatings can insulate the metal particles from oxidative environments. These coated metal particles can be used as fillers in a variety of applications. An example of particular interest is iron particles coated with silica or other material that is transparent to IR radiation. In addition, metals useful as the metal phase in cermet applications which are coated with a sintering aid are of particular interest.

5. Particles of an inorganic oxide, inorganic nitride or zeolite material that are coated with a catalytically active metal such as palladium, platinum, cobalt, zinc, magnesium, tungsten and the like.

6. Nanosized particles of metal or ceramic materials which are easily oxidized upon exposure to air, which are coated with a layer that protects the particle from oxidation. Specific examples are particles of iron and non-oxide ceramic materials such as titanium carbide, boron carbide, silicon carbide, tungsten carbide, aluminum nitride, boron nitride or silicon nitride, which are coated with, e.g., silica or alumina.

A suitable and preferred method for applying the coating is through atomic layer controlled growth techniques. Atomic layer controlled growth techniques permit the deposition of coatings of up to about 0.3 nm in thickness per reaction cycle, and thus provide a means of extremely fine control over coating thickness. In these techniques, the coating is formed in a series of two or more self-limited reactions, which in most instances can be repeated to sequentially deposit additional layers of the coating material until a desired coating thickness is achieved. In most instances, the first of these reactions will involve some functional group on the surface of the particle, such as an M—H, M—O—H or M—N—H group, where M represents an atom of a metal or semi-metal. The individual reactions are advantageously carried out separately and under conditions such that all excess reagents and reaction products are removed before conducting the succeeding reaction. It is preferred to treat the particles before initiating the reaction sequence to remove volatile materials that may be absorbed onto the surface. This is readily done by exposing the particles to elevated temperatures and/or vacuum. Also, in some instances a precursor reaction may be done to introduce desirable functional groups onto the surface of the particle, as described before.

Oxide coatings can be prepared on particles having surface hydroxyl or amine (M—N—H) groups using a binary (AB) reaction sequence as follows. The asterisk (*) indicates the atom that resides at the surface of the particle or coating, and Z represents oxygen or nitrogen. $M^1$ is an atom of a metal (or semimetal such as silicon), particularly one having a valence of 3 or 4, and X is a displaceable nucleophilic group. The reactions shown below are not balanced, and are only intended to show the reactions at the surface of the particles (i.e., not inter- or intralayer reactions).

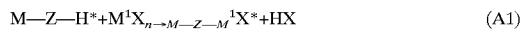  (A1)

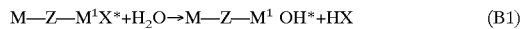  (B1)

In reaction A1, reagent $M^1X_n$ reacts with one or more M*—Z—H groups on the surface of the particle to create a new surface group having the form —$M^1$—X. $M^1$ is bonded to the particle through one or more Z atoms. The —$M^1$—X group represents a site that can react with water in reaction B1 to regenerate one or more hydroxyl groups. The groups formed in reaction B1 can serve as functional groups through which reactions A1 and B1 can be repeated, each time adding a new layer of $M^1$ atoms. Note that in some cases (such as, e.g., when $M^1$ is silicon, zirconium, titanium, boron, yttrium or aluminum) hydroxyl groups can be eliminated as water, forming $M^1$—O—$M^1$ bonds within or between layers. This condensation reaction can be promoted if desired by, for example, annealing at elevated temperatures and/or reduced pressures.

Binary reactions of the general type described by equations A1 and B2, where $M^1$ is silicon, are described more fully in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995), both incorporated herein by reference. Binary reactions of the general type described by equations A1 and B2, where $M^1$ is aluminum, are described in A. C. Dillon et al, "Surface Chemistry of $Al_2O_3$ Deposition using $Al(CH_3)_3$ and $H_2O$ in a Binary reaction Sequence", *Surface Science* 322, 230 (1995) and A. W. Ott et al., "$Al_2O_3$ Thin Film Growth on Si(100) Using Binary Reaction Sequence Chemistry", *Thin Solid Films* 292, 135 (1997). Both of these references are incorporated herein by reference. General conditions for these reactions as described therein can be adapted to construct $SiO_2$ and $Al_2O_3$ coatings on particulate materials in accordance with this invention. Analogous reactions for the deposition of other metal oxides such as $ZrO_2$, $TiO_2$ and $B_2O_3$ are described in Tsapatsis et al. (1991) *Ind. Eng. Chem. Res.* 30:2152–2159 and Lin et al., (1992), *AIChE Journal* 38:445—454, both incorporated herein by reference.

Analogous reaction sequences can be performed to produce nitride and sulfide coatings. An illustrative reaction sequence for producing a nitride coating is:

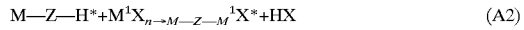  (A2)

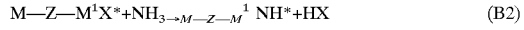  (B2)

Ammonia can be eliminated to form $M^1$—N—$M^1$ bonds within or between layers. This reaction can be promoted if desired by, for example, annealing at elevated temperatures and/or reduced pressures.

An illustrative reaction sequence for producing a sulfide coating is:

$$M-Z-H^* + M^1X_n \rightarrow M-Z-M^1X^* + HX \quad (A3)$$

$$M-Z-M^1X^* + H_2S \rightarrow M-Z-M^1\ SH^* + HX \quad (B3)$$

Hydrogen sulfide can be eliminated to form $M^1-S-M^1$ bonds within or between layers. As before, this reaction can be promoted by annealing at elevated temperatures and/or reduced pressures.

A suitable binary reaction scheme for depositing an inorganic phosphide coating is described in Ishii et al, *Crystal. Growth* 180 (1997) 15, incorporated herein by reference.

In the foregoing reaction sequences, preferred metals $M^1$ include silicon, aluminum, yttrium, boron, titanium, zinc, magnesium and zirconium. Suitable replaceable nucleophilic groups will vary somewhat with $M^1$, but include, for example, fluoride, chloride, bromide, alkoxy, alkyl, acetylacetonate, and the like. Specific compounds having the structure $M^1X_n$ that are of particular interest are silicon tetrachloride, tungsten hexafluoride, tetramethylorthosilicate ($Si(OCH_3)_4$), tetraethyl-orthosilicate ($Si(OC_2H_5)_4$), trimethyl aluminum ($Al(CH_3)_3$), triethyl aluminum ($Al(C_2H_5)_3$), other trialkyl aluminum compounds, yttrium acetylacetonate, cobalt acetylacetonate, and the like.

In addition, catalyzed binary reaction techniques such as described in copending application 08/942,522 entitled "Method of Growing Films on Substrates at Room Temperatures Using Catalyzed Binary Reaction Sequence Chemistry", incorporated by reference, are suitable for producing coatings, especially oxide, nitride or sulfide coatings, most preferably oxide coatings. Reactions of this type can be represented as follows:

$$M-F_1 + C_1 \rightarrow M-F_1 \ldots C_1 \quad (A4a)$$

$$M-F_1 \ldots C_1 + F_2-M^1-F_2 \rightarrow M-M^1-F_2 + F_1 + F_2 + C_1 \quad (A4b)$$

$$M-M^1-F_2 + C_2 \rightarrow M-M^1-F_1 \ldots C_2 \quad (B4a)$$

$$M-M^1-F_1 \ldots C_2 + F_1-M-F_1 \rightarrow_{M-M^1} -M-F_1+F_1-F_2 \quad (B4b)$$

$C_1$ and $C_2$ represent catalysts for the A4b and B4b reactions, and may be the same or different. $F_1$ and $F_2$ represent functional groups, and M and $M^1$ are as defined before, and can be the same or different. Reactions A4a and A4b together constitute the first part of a binary reaction sequence, and reactions B4a and B4b together constitute the second half of the binary reaction sequence. An example of such a catalyzed binary reaction sequence is:

$$Si-OH^*(particle) + C_5H_5N \rightarrow Si-OH \ldots C_5H_5N^*$$

$$Si-OH \ldots C_5H_5N^* + SiCl_4 \rightarrow Si-O-SiCl_3^* + C_5H_5N + HCl$$

$$Si-O-SiCl_3^* + C_5H_5N \rightarrow Si-O-SiCl_3 \ldots C_5H_5N^*$$

$$Si-O-SiCl_3 \ldots C_5H_5N^* + H_2O \rightarrow Si-O-SiOH^* + C_5H_5N + HCl$$

where the asterisks (*) again denote atoms at the surface of the particle. This general method is applicable to forming various other coatings, including zirconia or titania.

Suitable binary reaction schemes for depositing metal coatings include those described in the copending application filed Mar. 10, 2000 entitled "A Solid Material Comprising a Thin Metal Film on its Surface and Methods for Producing the Same", which is incorporated herein by reference. A specific reaction scheme described therein involves sequential reactions of a substrate surface with a metal halide followed by a metal halide reducing agent. The metal of the metal halide is preferably a transition metal or a semimetallic element, including tungsten, rhenium, molybdenum, antimony, selenium, thallium, chromium, platinum, ruthenium, iridium, and germanium. The halide is preferably fluoride. The reducing agent is a silylating agent such as silane, disilane, trisilane and mixtures thereof For depositing a tungsten coating, the sequence of reactions can be represented as:

$$M-OH^*(particle) + Si_2H_6 \rightarrow M-Si^*_2H_5 \quad \text{(precursor reaction)}$$

$$M-Si^*_2H_5 + WF_6 \rightarrow M-W-F^* + Si_2H_6 \quad (A5)$$

$$M-W-F^* + Si_2H_yF_z \rightarrow M-W-Si^*_2H_5 + H_2 + SiH_aF_b \quad (B5)$$

Here, y, z, a and b represent positive integers that reflect an electrostatically neutral compound.

Another binary reaction scheme suitable for depositing a metal ($M^2$) film on a particle having surface hydroxyl or amine groups can be represented as:

$$M^*-Z-H + M^2X_n \rightarrow_{M-Z-M}{}^{2*}X + HX \quad \text{(precursor reaction)}$$

$$M-Z-M^2X^* + H_2 \rightarrow M-Z-M^2-H^* + HX \quad (B6)$$

$$M-Z-M^2-H^* + M^2(acac)\ M-Z-M^2-M^{2*}\ (acac) \quad (A6)$$

"Acac" refers to acetylacetonate ion, and X, Z and M are as defined before. Also as before, the asterisk (*) refers to an atom residing at the surface of the particle. By heating to a sufficient temperature, hydrogen bonded to the surface as $M^2-H$ will thermally desorb from the surface as $H_2$, thereby generating a final surface composed of $M^2$ atoms. Cobalt, iron and nickel are preferred metals for coating according to reaction sequence A6/B6.

Except for the catalyzed reaction scheme described above, the binary reactions are generally performed at elevated temperatures, preferably from about 400–1000 K. Between reactions, the particles are subjected to conditions sufficient to remove reaction products and unreacted reagents. This can be done, for example, by subjecting the particles to a high vacuum, such as about $10^5$ Torr or less, after each reaction step. Another method of accomplishing this, which is more readily applicable for industrial application, is to sweep the particles with an inert purge gas between the reaction steps. This purge gas can also act as a fluidizing medium for the particles and as a carrier for the reagents.

Several techniques are useful for monitoring the progress of the reaction. For example, vibrational spectroscopic studies can be performed on high surface area silica powders using transmission Fourier transform infrared techniques. The deposited coatings can be examined using in situ spectroscopic ellipsometry. Atomic force microscopy studies can be used to characterize the roughness of the coating relative to that of the surface of the substrate. X-ray photoelectron spectroscopy and x-ray diffraction can by used to do depth-profing and ascertain the crystallographic structure of the coating.

A convenient method for applying the ultrathin, conformal coating to the base is to form a fluidized bed of the particles, and then pass the various reagents in turn through the fluidized bed under reaction conditions. Methods of fluidizing particulate material are well known, and generally include supporting the particles on a porous plate or screen.

A fluidizing gas is passed upwardly through the plate or screen, lifting the particles somewhat and expanding the volume of the bed. With appropriate expansion, the particles behave much as a fluid. Fluid (gaseous or liquid) reagents can be introduced into the bed for reaction with the surface of the particles.

In this invention, the fluidizing gas also can act as an inert purge gas for removing unreacted reagents and volatile or gaseous reaction products.

In addition, the reactions can be conduced in a rotating cylindrical vessel or a rotating tube.

If desired, multiple layers of ultrathin coatings can be deposited on the particle. This method has application where, due to the chemical nature of the base particle, the desired coating cannot easily be applied directly to the particle surface. In such cases, an intermediate ultrathin layer can be applied to provide a surface to which the desired outer layer can be applied more easily. A specific instance of this is the application of a surface silica layer on boron nitride particles. As shown in Example 2 below, silica deposits somewhat unevenly onto the basal planes of boron nitride. However, by first applying a layer of alumina to the boron nitride particles, a surface is provided that can be easily overcoated with silica.

It is also within the scope of this invention to apply a coating using atomic layer deposition methods as described before, and then conduct one or more reactions on the coating thus formed in order to modify the coating. This technique is useful for creating ultrathin coatings of various types that are not amenable to deposition using atomic layer deposition techniques. For example, various types of ultrathin oxide coatings can be formed using the atomic layer deposition techniques described above, and then can be carburized to convert the oxide to the corresponding carbide. A specific example of this is to make zirconium oxide particles that are wettable within a nickel aluminide metal matrix. This can be accomplished by depositing an ultrathin titanium oxide coating using a binary reaction scheme, and then carburizing the coating to form zirconium oxide particles having an ultrathin titanium carbide coating.

The coated particles of the invention are useful in a wide variety of depending mainly on the composition of the particulate material. Sinterable coated particles can be formed into various shapes and sintered using well-known methods to form ceramic parts. Pressureless sintering processes are of particular interest. By selecting a coating that acts as a sintering aid, this invention provides a convenient method by which the sintering aid can be very uniformly distributed throughout the part before sintering is begun. It is believed that this can in some cases make the sintering process more efficient, lower sintering temperatures somewhat, and result in better densification of the material through the sintering process. The ability to reduce sintering temperatures is of particular interest, as it provides an opportunity to reduce energy costs. In some instances, as with sintering AlN, the ability to lower sintering temperatures can permit one to avoid the need to use sintering ovens that are specially adapted to handle high temperatures. In particular, the ability to reduce the sintering temperature of AlN to about 1600° C. or less permits AlN to be sintered in alumina refractory-lined sintering furnaces instead of graphite-lined furnaces that are now required. In these applications, particles having surface areas, before coating, of 10 $m^2/g$ or higher are of special interest.

This invention also provides a method of forming ceramic parts from two or more different sinterable inorganic materials, wherein at least one of the materials in the form of a particulate having an ultrathin coating of a sintering aid or metal. The fine dispersion of sintering aid or metal provides for better adhesion between the different types of particles to provide better quality sintered parts.

Similarly, metal-coated ceramic materials according to the invention can be shaped and sintered to form cermets. This permits fine distribution of the metal phase throughout the shaped form prior to sintering. This in turn enhances the distribution of the metal in the final part, resulting in a part having a more uniform composition. The use of metal-coated ceramic materials according to the invention also permits one to reduce the amount of metal powder that is needed, or to eliminate it entirely. A system of particular interest is a tungsten carbide-based cermet. Cobalt is used as the metal phase in conventional cermet manufacturing techniques in order to improve toughness and sinterability, but the presence of cobalt tends to undesirably reduce the hardness of the final part. The use of tungsten carbide particles having an ultrathin cobalt coating potentially provides a way to make good tungsten carbide cermet materials that retain much of the hardness of tungsten carbide.

In another application, the particles of the invention are incorporated into a thermoplastic or thermoset resin as a filler or for some functional purpose. Of particular interest are epoxy resins filled with nitride particles that are coated with alumina and/or silica to enhance the compatibility of the particles with the resin matrix. These filled resins can be used to encapsulate electronic parts. Thus, in a preferred aspect, this invention includes a thermoplastic or thermoset resin containing particles of the invention. In a related aspect, this invention is an electronic component encapsulated in a resin matrix filled with particles of AlN, BN or $Si_3N_4$ that are coated with an ultrathin, conformal alumina or silica coating.

In yet another application for certain particles according to the invention, the coating is a metal having catalytic activity. In these applications, a chemical reaction is conducted in the presence of particles coated with a metal that is a catalyst for the reaction.

Still another specific application is to coat submicron iron particles with an infrared-transparent ultrathin coating such as silica. The resulting particles are rust-resistant yet radar-absorbent.

The following examples are provided to illustrate the invention, but are not intended to limit its scope. All parts and percentages are by weight unless otherwise indicated.

EXAMPLE 1—ATOMIC LAYER DEPOSITION OF ALUMINA ON BN PARTICLES

Alumina ($Al_2O_3$) is deposited on BN particles in a vacuum apparatus designed for *in situ* transmission FTIR vibrational spectroscopy studies. This apparatus is described in more detail by Dillon et al. (1992) *J. Electrochem. Soc.* 139:537–543, as well as in the copending application 08/442,907, filed May 17, 1995, both incorporated by reference. The BN nitride particles are HCV Grade BN particles from Advanced Ceramics Corporation. They are approximately 10 micron agglomerates composed primarily of approximately 0.1–0.5 micron turbostratic crystals with a total surface area of about 40 $m^2/g$.

The BN particles are supported on a tungsten photoetched grid from Buckbee Mears, St. Paul, Minn., having dimensions of 2×3 cm, a thickness of 2 mils and a spacing of 100 lines per inch. The BN particles are pressed into the tungsten grid using polished stainless steel dies and a manual press. Tantalum foil is spot-welded to each side of the grid to provide good electrical contacts and facilitate resistive heating. A Chromel-Alumel thermocouple is glued to the center edge of the grid using Aremco Type 571 ceramic adhesive. The grid is then suspended between two copper clamps in an x-y-z manipulator, between 13 mm cesium iodide windows. The manipulator is equipped with liquid $N_2$ cryostat and current and thermocouple feedthroughs for sample heating and temperature regulation. A Nicolet 740 FTIR spectrometer and corresponding MCT detector are situated by opposing cesium iodide windows.

A gate valve separates the apparatus into an upper chamber and a lower chamber. Dual turbo pumps are provided to maintain a high vacuum in lower chamber. A second gate valve connects the turbo pumps with the lower chamber. The lower chamber is equipped with an ion gauge and a Dycor quadruple mass spectrometer.

After loading the BN particles into the upper chamber, the samples are annealed at 700° K. to remove an observed $H_2O$ adlayer from the surface of the particles. To observe the surface functionality of the particles, they are exposed to $D_2O$ at 700° K. in order to exchange hydrogen atoms for deuterium atoms. FTIR then confirms the presence of surface B—O—D and B—N—D groups on the surface of the particles.

The particles are then sequentially exposed to 50 cycles of $Al(CH_3)_3$ and water at 450° K. to deposit 90 angstrom coatings of alumina onto the particle surfaces. Reactant exposures of $1.8 \times 10^8$ Langmuirs (L,=$10^{31\ 6}$ Torr·sec)are used in each reaction in order to ensure that the reaction goes to completion in each step. Low pressure exposures consist of reactant pressures in the range of $1 \times 10^{-4}$ to $1 \times 10-3$ Torr, with the gate valve between the upper and lower chambers open. For high pressure exposures, the upper chamber is evacuated with a liquid $N_2$ trap backed by a mechanical pump to provide exposures at 0.01 to 10 Torr. The upper chamber is then opened to the lower chamber and the turbomolecular pump to provide pressures of less than $2 \times 10^{-6}$ Torr between exposures. Approximately 1.8 angstroms of $Al_2O_3$ growth are seen per reaction cycle.

B—O—H AND B—N—H stretching vibrations decrease progressively as the sequence is repeated, essentially disappearing after six cycles. This indicates that only six reaction cycles are needed to initiate $Al_2O_3$ growth on the entire surface of the particles. X-ray photoelectron spectroscopy (AXIS Hsi Kratos Analytical XPS spectrometer, base pressure $1 \times 10^9$ Torr,$\Delta E$=constant mode at a pass energy of 80 eV using an Al anode (1486.7 eV energy at 15 kV,15 mA) in a slot mode) of the final product reveals negligible photoelectron intensity associated with boron nitride, again confirming essentially complete contain of the particle surfaces. Transmission electron microscopy images are obtained with a HRTEM JEOL 2010 high resolution transmission electron microscope using electron dispersive spectroscopy and GATAN digital microgram with a slow scan CCD camera. TEM shows that the product has extremely uniform and conformal $Al_2O_3$ coatings having a thickness of about 90 angstroms. The coating is deposited well on the basal planes and edges of the particles.

Example 2

In this example, a silica ($SiO_2$) coating is applied to BN particles using the apparatus described in example 1. In this case, the reagents are $SiCl_4$ and water, and 32 reaction cycles are performed. Exposure is performed at 700° K., and exposures of about $1 \times 10^{10}$L are used. Low pressure exposures are at pressures of $1 \times 10^{-4}$ to $1 \times 10^{-3}$ Torr and high pressure exposures range from 0.01 to 10 Torr. Pressures between exposures are less than $2 \times 10^{-6}$ Torr.

TEM images of the product show that the basal planes of the BN particles are randomly covered with $SiO_2$, whereas the edge planes are fairly uniformly covered.

What is claimed is:

1. A method for depositing an ultrathin conformal coating on particles comprising conducting a sequence of two or more self-limiting reactions at the surface of said particles to form an ultrathin conformal coating bonded to the surface of said particles.

2. The method of claim 1, wherein the sequence is a binary sequence of reactions represented as

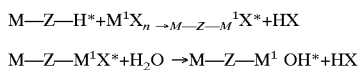

wherein Z represents oxygen or nitrogen, $M^1$ is an atom of a metal or semimetal and a X is a displaceable nucleophilic group.

3. The method of claim 2 wherein $M^1$ is silicon, titanium or aluminum.

4. The method of claim 2 wherein the sequence is a binary sequence of reactions represented as

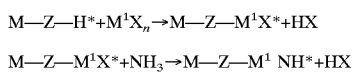

wherein Z represents oxygen or nitrogen, $M^1$ is an atom of a metal or semimetal and X is a displaceable nucleophilic group.

5. The method of claim 2 wherein the sequence is a binary sequence of reactions represented as

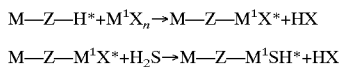

wherein Z represents oxygen or nitrogen, $M^1$ is an atom of a metal or semimetal and X is a displaceable nucleophilic group.

6. The method of claim 1 wherein the particles are an inorganic nitride or carbide.

7. The method of claim 2 wherein the particles are an inorganic nitride or carbide.

8. The method of claim 4 wherein the particles are an inorganic nitride or carbide.

9. The method of claim 5 wherein the particles are an inorganic nitride or carbide.

10. The method of claim 1 wherein the sequence of reactions is continued until a coating of desired thickness is obtained.

11. The method of claim 10 wherein the ultrathin coating has a thickness of about 0.5 to about 35 nanometers.

12. The method of claim 1 wherein a precursor reaction is conducted to impart functional groups on the surface of the particle before conducting said sequence of reactions.

13. The method of claim 1 wherein said sequence of reactions is a sequence of catalyzed reactions.

14. The method of claim 1 wherein said sequence of reactions is a binary sequence of reactions comprising contacting said particle with alternately with a metal halide and a metal halide reducing agent.

15. The method of claim 14 wherein said metal halide is a fluoride or chloride of tungsten, rhenium, molybdenum, antimony, selenium, thallium, chromium, platinum, ruthenium, iridium, or germanium.

16. The method of claim 1 which is conducted in a fluidized bed of said particles.

17. The method of claim 1 wherein the particles have a particle size of from about 0.005 to about 100 μm.

18. The method of claim 1 which is an atomic layer controlled growth process.

19. The method of claim 2 which is an atomic layer controlled growth process.

20. The method of claim 4 which is an atomic layer controlled growth process.

21. The method of claim 5 which is an atomic layer controlled growth process.

22. The method of claim 4 which is an atomic layer controlled growth process.

23. The method of claim 13 which is an atomic layer controlled growth process.

24. The method of claim 16 which is an atomic layer controlled growth process.

25. The method of claim 17 which is an atomic layer controlled growth process.

26. A method for depositing an ultrathin coating on particles comprising conducting a sequence of two or more self-limiting reactions at the surface of said particles to form an ultrathin coating bonded to the surface of said particles.

* * * * *

UNITED STATES PATENT AND TRADEMARK OFFICE
CERTIFICATE OF CORRECTION

PATENT NO. : 6,613,383 B1 Page 1 of 1
DATED : September 2, 2003
INVENTOR(S) : Steven M. George, John D. Ferguson and Alan W. Weimer It is certified that error appears in the above-identified patent and that said Letters Patent is hereby corrected as shown below:

<u>Column 12,</u>
Lines 21 and 29, "claim 2" should read -- claim 1 --.

<u>Column 13,</u>
Line 9, "claim 4" should read -- claim 11 --.

Signed and Sealed this

Tenth Day of February, 2004

JON W. DUDAS
*Acting Director of the United States Patent and Trademark Office*